United States Patent [19]

Caron

[11] 4,125,811

[45] Nov. 14, 1978

[54] CIRCUIT FOR MULTIPLYING TWO VARIABLES

[75] Inventor: LaVerne A. Caron, Rochester, Mich.

[73] Assignee: Chrysler Corporation, Highland Park, Mich.

[21] Appl. No.: 806,876

[22] Filed: Jun. 15, 1977

Related U.S. Application Data

[63] Continuation-in-part of Ser. No. 772,604, Feb. 28, 1977.

[51] Int. Cl.² ............................................. H03K 9/08
[52] U.S. Cl. ..................................... 328/160; 328/58; 328/134; 307/261; 307/265
[58] Field of Search .......................... 328/134, 160, 58; 307/234, 265, 261

[56] References Cited

U.S. PATENT DOCUMENTS

| | | | |
|---|---|---|---|
| 3,383,604 | 5/1968 | Weiss | 328/134 |
| 3,539,926 | 11/1970 | Breikss | 307/265 X |
| 4,009,400 | 2/1977 | Harris et al. | 307/233 A |
| 4,052,676 | 10/1977 | Crittenden | 328/134 |

*Primary Examiner*—John S. Heyman
*Attorney, Agent, or Firm*—Baldwin & Newtson

[57] ABSTRACT

A circuit for multiplying two variables wherein one variable is represented by the pulse width of the pulses of a variable pulse width, constant frequency rectangular waveform signal and the second variable is represented by the level of a variable amplitude signal. When the value of the first variable is zero, pulses of the rectangular waveform signal have a definite non-zero pulse width. An oscillator cicuit produces a reference rectangular waveform signal having a frequency equal to that of the first rectangular waveform signal. From these two rectangular waveform signals there is developed a third rectangular waveform signal having the same frequency but having the width of its pulses directly proportional to the value of the first variable so that the pulses are of zero width when the first variable is zero. A fourth rectangular waveform signal is developed from the third rectangular waveform signal and from said variable amplitude signal such that the pulse amplitude of said fourth rectangular waveform signal is proportional to the value of the second variable and the pulse width is directly proportional to the value of the first variable. The fourth rectangular waveform signal is passed through a low pass filter to produce a DC signal whose magnitude is directly proportional to the area of the output pulses of the fourth rectangular waveform signal and hence to the product of the two variables.

3 Claims, 7 Drawing Figures

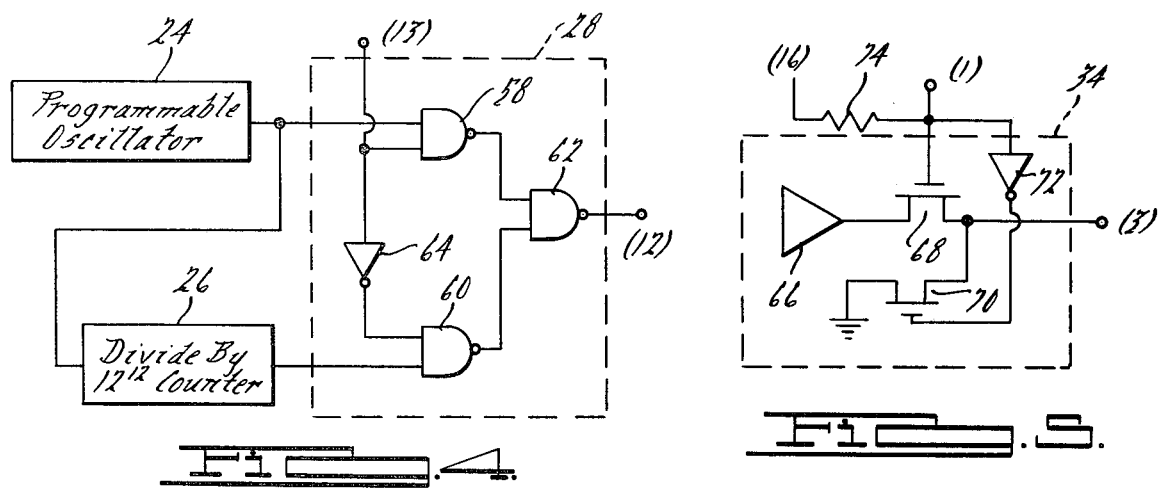
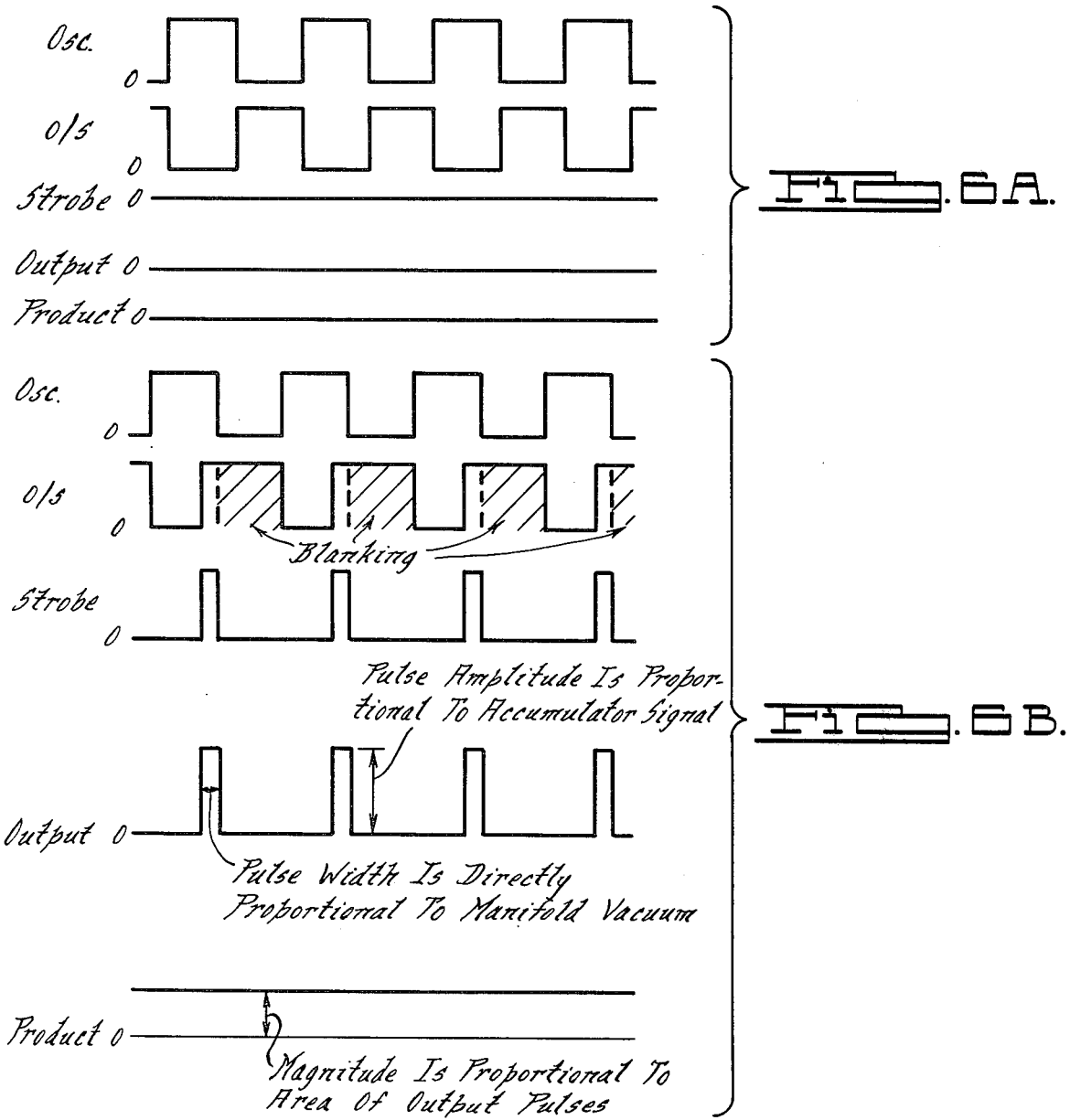

CIRCUIT FOR MULTIPLYING TWO VARIABLES

This application is a continuation-in-part of Ser. No. 772,604, filed Feb. 28, 1977.

BACKGROUND AND SUMMARY OF THE INVENTION

This invention pertains to a circuit for multiplying one variable by another and is particularly concerned with a circuit which is useful in a number of applications one of which is in an electronic engine control circuit for use with an internal combustion engine spark timing system.

In U.S. Pat. No. 3,978,833, dated Sept. 7, 1976, and assigned to the same assignee as the present application, there is disclosed a circuit for providing a programmed engine control function signal which is specifically disclosed as a programmed vacuum advance signal. This programmed vacuum advance signal is developed from engine manifold vacuum and from an accumulation function which is representative of the duration for which the engine has been operating in selected operating modes. Within its control range between maximum and minimum limits of vacuum spark advance, the programmed vacuum advance signal is developed as a function of the product of these two variables, namely (1) instantaneous engine manifold vacuum, as monitored by a vacuum transducer and associated transducer circuit, and (2) the accumulation function which increases in magnitude as a function of time when the engine is in a non-idle operating condition and which decreases in magnitude as a function of time when the engine is operating at idle condition. The vacuum transducer and associated transducer circuit disclosed in that patent develop a constant frequency rectangular waveform wherein the pulse width of the pulses comprising the waveform is representative of engine manifold vacuum. However, the relationship is such that at zero manifold vacuum the pulses have a definite non-zero pulse width. Thus, the product of the pulse width of the rectangular waveform signal by the accumulation function would yield an incorrect result where it is desired to obtain the product of manifold vacuum by the accumulation function. In order to obtain the correct product of manifold vacuum and accumulation function signal, it becomes necessary to make allowance for the non-zero width of the pulses which exists at zero manifold vacuum. Accordingly, a special circuit which makes this allowance is provided in that patent.

The present invention is concerned with an improvement upon the scheme disclosed in the foregoing patent. The advantages of the improvement afforded by the present invention are as follows.

The gain of the output amplifier is much easier to set. The previous system uses a more complex vacuum amplifier requireing proper choice of four interactive resistors. It is often difficult to find four appropriate resistors among standard values in order to achieve a desired gain while staying within impedance limits imposed by the system. With the present invention, development of engine control systems can be speeded up as systems can now be provided with a variable gain adjusted by a potentiometer. This capability was not available in the previous system as simultaneous adjustment of four interacting resistors was not practical. Additional advantages of the invention will be seen as the description proceeds.

BRIEF DESCRIPTION OF THE DRAWINGS

FIG. 4 is a schematic diagram illustrating another portion of FIG. 2 in greater detail.

FIG. 5 is a schematic diagram illustrating yet another portion of FIG. 2 in greater detail.

FIGS. 6A and 6B are diagrams of selected signal waveforms useful in explaining the operation of the circuit of FIG. 1.

DESCRIPTION OF THE PREFERRED EMBODIMENT

Figure 1:
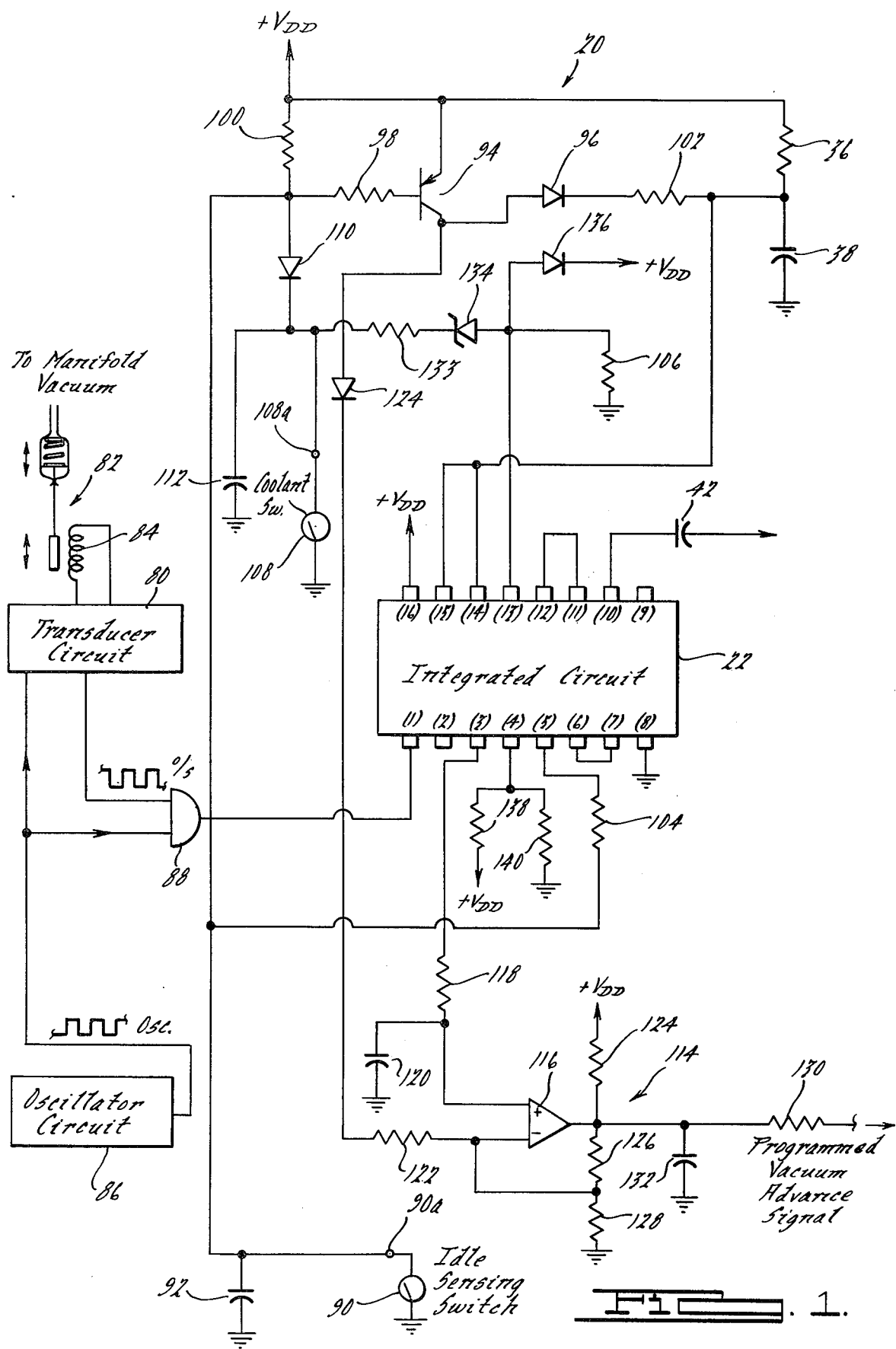
FIG. 1 is an electrical schematic diagram of a circuit embodying principles of the present invention.
Figure 2:
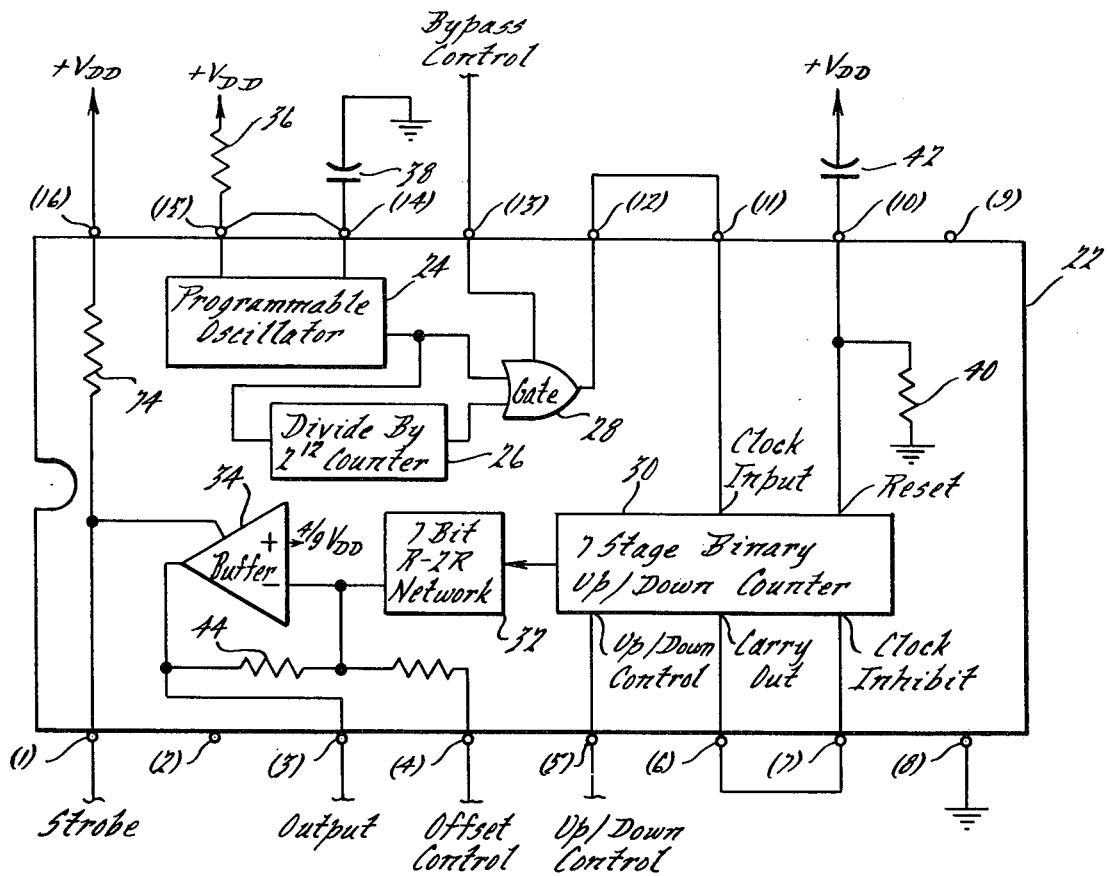
FIG. 2 is an electrical schematic diagram illustrating a portion of FIG. 1 in greater detail.

FIG. 1 illustrates a circuit 20 embodying principles of the present invention and comprising an integrated circuit device 22 having a plurality of terminals via which it may be connected in circuit 20. The terminals of device 22 are identified by the parenthetically enclosed numerals (1) through (16) inclusive. The terminals (8), (16), provide for connection of a source of D.C. energizing potential for energizing integrated circuit 22 from a power supply such as $+V_{DD}$ as illustrated. Circuit 22 is disclosed in more detail in FIG. 2 and contains a programmable oscillator stage 24, a divide by $2^{12}$ counter stage 26, and a gate 28 which form one portion of the circuitry therein. Also included as a second portion of circuitry on integrated circuit 22 are a seven stage binary up/down counter 30, a seven bit R-2R network 32 and an output buffer stage 34 having a resistor 44 connected between its output and its inverting input. Programmable oscillator 24 is operably associated with terminals (15), (14), which provide for connection of external circuit components which establish the oscillating frequency of the stage. Accordingly, an RC circuit comprising a resistor 36 and a capacitor 38 are connected in circuit as illustrated with terminals (15), (14). The oscillator stage produces an oscillating output signal which is supplied to one input of gate 28. The oscillating signal is also supplied to the input of counter 26 and the output of the latter is supplied as an input to the second input of gate 28. Preferably, oscillator stage 24, in cooperation with resistor 36 and capacitor 38, is configured to provide for a fairly high frequency signal, for example, a frequency of three kilohertz. Counter 26 frequency divides the oscillating signal of oscillator stage 24 to produce a much lower frequency signal, which in the example is at a frequency of $2^{-12}$ times the frequency of the oscillating signal provided by stage 24. Terminal (13) is operably associated with gate 28 and the gate output is connected to terminal (12). A bypass control signal is intended to be supplied to terminal (13) to selectively control the transmission of the oscillator signal and the frequency-divided version thereof through gate 28 to terminal (12). The bypass control signal will cause the frequency-divided version of the oscillating signal to be conducted through gate 28 to terminal (12) to the exclusion of the oscillating signal itself whenever the bypass control signal is at a logic zero signal level. Correspondingly, when the bypass control signal is at a logic one signal level, the gate transmits the actual oscillating signal to terminal (12) to the exclusion of the frequency-divided version thereof.

In the utilization of integrated circuit 22 in circuit 20, terminal (12) directly connects to terminal (11). Terminal (11) in turn, connects with the clock input of the seven stage binary up/down counter 30 so that counter 30 can count the oscillations of the signal which is supplied by gate 28. Counter stage 30 may be fabricated according to conventional techniques to provide a seven bit binary output signal which is representative of the number of oscillations counted by the counter. Certain control inputs and outputs of counter 30 are connected with selected ones of the terminals to provide for certain external control of the counter. For one, the reset input of the counter connects to terminal (10). An internal resistor 40 and an external capacitor 42, connected as illustrated, provide for coupling of a reset pulse to the counter whenever the DC power supply is activated. This insures that the count in the counter will be reset to an all ones condition when the power is turned on. An up/down control input of the counter connects to terminal (5) so that the direction in which the counter counts can be controlled by an external up/down control signal applied to terminal (5). By way of example, counter 30 will count down when the up/down control signal is at a logic one and up when the up/down control signal is at a logic zero. The carry out output of the counter connects to terminal (6) and the clock inhibit input connects to terminal (7). In the illustrated usage, terminals (6) and (7) are directly connected together by means of an external connection. By providing this connection, the counter operates in a nonoverflow mode. Thus, when an all ones or all zeros state is achieved, the counter will hold this state until made to count in an opposite direction. Details of fabrication of such a seven bit binary up/down counter are known in the art and details thereof are not explained herein in the interest of brevity.

The seven bits constituting the seven bit binary output of the counter are coupled to R-2R network 32. The R-2R network 32 converts the binary count contained in counter 30 into an analog signal whose magnitude corresponds to the actual count in the counter.

This analog signal is in turn supplied to the inverting input of output stage 34. The non-inverting input of stage 34 is connected to an appropriate fraction of the $+V_{DD}$ supply, preferably $4/9\ V_{DD}$ as shown. Disregarding for a moment the additional control features associated with output stage 34 which will be described in detail hereinafter, the output stage produces an Output signal whose amplitude is proportional to the magnitude of the analog signal received from R-2R network 32. This signal appears at terminal (3). The illustrated construction of output stage 34 is such that the Output signal becomes more positive as the analog signal from R-2R network 32 becomes less positive and vice versa. This is because of the inverting characteristic of output stage 34. Thus, when counter 30 is reset to an all ones state at power up, the Output signal at terminal (3) assumes a minimum magnitude. As the count in the counter progressively decreases toward an all zeros state, the Output signal at terminal (3) progressively increases toward a maximum signal level.

In accordance with additional control features of integrated circuit 22, additional inputs and circuitry are associated with output stage 34. These include: a strobe input connected with terminal (1) at which a Strobe signal is applied; and an offset input connected with terminal (4) at which an Offset Control signal is applied. Briefly, the application of an Offset Control signal to terminal (4) causes the output signal produced by stage 34 to be offset in voltage from that which would otherwise be produced were the offset control feature not provided. The amount of the offset is a function of the magnitude of the Offset Control voltage signal, as will be explained more fully hereinafter. The Strobe signal provides for selective transmission of the signal from buffer 34 to terminal (3) in accordance with the Strobe signal applied to terminal (1). Having therefore briefly described the basic elements to FIG. 2, attention can now be directed to more specific details which are shown in FIGS. 3 through 5.

Figure 3:
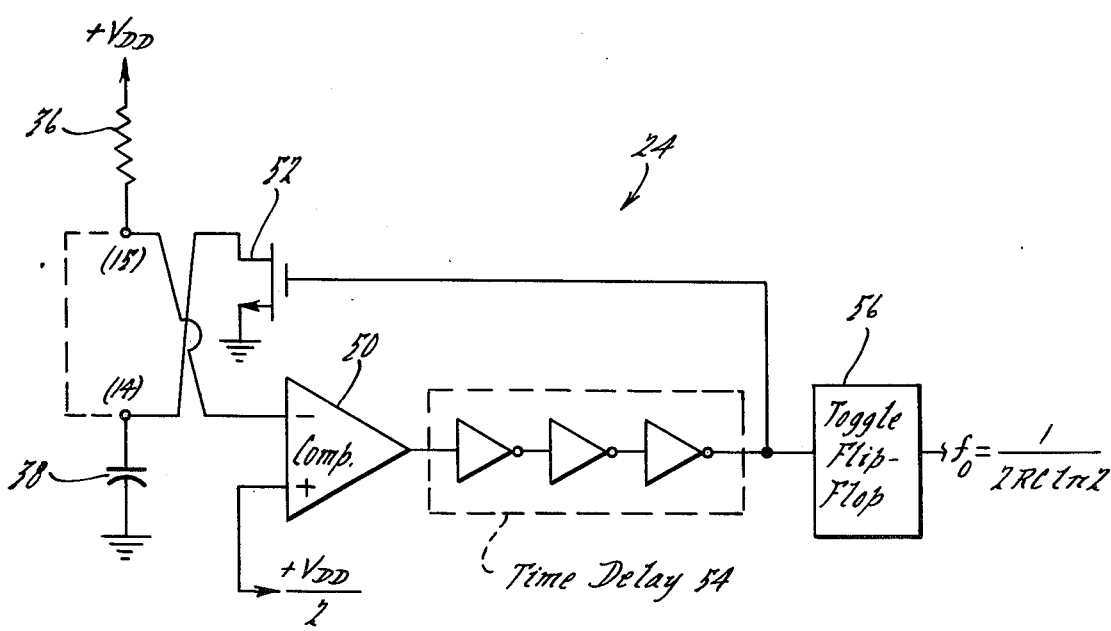
FIG. 3 is an electrical schematic diagram illustrating a portion of FIG. 2 in greater detail.

In FIG. 3 a possible implementation for programmable oscillator 24 is illustrated. In this implementation, the resistor 36 and capacitor 38 are serially connected across the DC potential with the junction of the two being connected to the inverting input of a comparator 50 and to the source terminal of a field effect transistor (FET) 52. The non-inverting input of comparator 50 is connected to one half of the DC supply voltage. The drain terminal of FET 52 connects to ground, and the gate connects to the output of a time delay circuit 54 whose input is connected to the output of comparator 50. The output of time delay circuit 54 also connects to a toggle flip-flop 56. This implementation operates in the following manner. Capacitor 38 tends to charge toward $+V_{DD}$ through resistor 36 with a charging rate being determined by the time constant of resistor 36 and capacitor 38. However, transistor 52 discharges capacitor 38 before it can be fully charged and thus, a repeated oscillation is sustained. Comparator 50 monitors the voltage across capacitor 38 and when the voltage exceeds the reference $+V_{DD}/2$, transistor 52 switches into conduction to discharge the capacitor. Once the capacitor discharges, comparator 50 switches back to its original condition causing conduction of transistor 52 to terminate. Delay circuit 54 serves to maintain transistor 52 in conduction for an interval just long enough to ensure discharge of capacitor 38. The toggle flip-flop 56 develops in turn, a square wave oscillation having a 50% duty cycle. It is this square wave which represents the output signal of oscillator stage 24. The frequency, $f_o$, of the square waveform output of flip-flop 56 is given by the formula $$f_o = 1/(2\ RC\ ln2)$$

where R is the resistance of resistor 36 and C is the capacitance of capacitor 38.

In FIG. 4, a possible implementation for gate 28 is shown. Gate 28 comprises a plurality of three NAND gates 58, 60, 62 and an inverter 64 connected as illustrated. The oscillating signal from oscillator 24 is supplied to one input of gate 58 while the frequency-divided version thereof is supplied to one input of gate 60. Terminal (13) directly connects to the other input of gate 58 and through inverter 64 to the other input of gate 60. In this way the signal applied to terminal (13) selectively controls the transmission of the oscillator signal and frequency-divided version thereof through the gate 28 to terminal (12).

FIG. 5 illustrates a possible implementation for output stage 34. The implementation includes a conventional comparator 66, a pair of transmission gates 68 and 70 respectively, and an inverter 72. These components are connected as illustrated. Terminal (1) is connected via an internal pull-up resistor 74 with the positive polarity terminal $+V_{DD}$. The Strobe signal at terminal (1)

selectively controls transmission gates 68 and 70 such that when the Strobe signal is high, the output signal at the output of comparator 66 is transmitted through gate 68 to terminal (3) while when the strobe control signal is low the transmission gate 70 is caused to transmit the ground signal through to terminal (3).

With this background in mind relative to the organization and operation of integrated circuit 22, attention is now directed to details of circuit 20 as disclosed in FIG. 1. Components in FIG. 1 corresponding to those in FIGS. 2 through 5 are identified by like reference numerals. FIG. 1 discloses the preferred embodiment of the invention in an electronic engine control system, specifically an electronic spark timing system, which develops a programmed vacuum advance signal (sometimes called Product signal hereinafter). The programmed vacuum advance signal serves the same purpose as that which is disclosed in the above referenced U.S. Pat. No. 3,978,833. As will be recalled from the earlier description in connection with the background of the invention, the programmed vacuum advanced signal is a function of the product of an accumulation function signal and engine manifold vacuum. It is therefore necessary to develop an accumulation function signal and an engine manifold vacuum signal. The development of the manifold vacuum signal will be considered first.

In FIG. 1 the manifold vacuum signal O/S is a rectangular waveform which is provided by a transducer circuit 80. Engine manifold vacuum is monitored by a variable inductance vacuum transducer 82 which operates to modulate the inductance of a coil 84 in accordance with the intensity of manifold vacuum. There is further provided an oscillator circuit 86 producing a rectangular waveform Osc which is utilized in conjunction both with transducer circuit 80 to develop the transducer output signal O/S as well as with additional circuitry in the implementation of the multiplication scheme of the present invention. Both transducer circuit 80 and vacuum transducer 82 may be exactly like those disclosed and described in the foregoing U.S. Pat. No. 3,978,833. Oscillator 86 may be similar to the oscillator disclosed in that patent with the exception that the pulse width of the positive-going pulses is made equal to the duration between pulses so that the signal Osc exhibits a 50% duty cycle operation. The oscillator disclosed in U.S. Pat. No. 3,978,833 can be made to have a 50% duty cycle by disconnecting the diode which connects between the output and the inverting input of the comparator utilized in the oscillator and is AC coupled to circuit 80 for triggering. Preferably the frequency is adjusted to be in the three kilohertz range.

As explained in the foregoing patent, transducer circuit 80 is tripped by each positive-going edge of the oscillator signal Osc to thereby develop the waveform O/S wherein the width of each positive-going pulse thereof is representative of manifold vacuum. In the disclosed construction of the preferred embodiment, vacuum transducer 82 is arranged and constructed such that the inductance of coil 84 decreases as the intensity of manifold vacuum increases. Also, transducer circuit 80 is arranged and constructed with a monostable circuit stage, producing a negative-going output pulse in response to tripping thereof by the positive-going edge of the oscillator signal Osc. The pulse width of this negative-going pulse decreases as manifold vacuum increases so that the width of the positive-going pulses of signal O/S increases with increasing manifold vacuum. However, at zero manifold vacuum these pulses have a definite non-zero width. Pursuant to the present invention the frequency of the oscillator 86 is set to produce a 50% duty cycle in the transducer circuit output signal O/S at zero manifold vacuum. It will be appreciated that both waveform O/S and Osc are at the same frequency by virtue of the tripping of transducer circuit 80 from oscillator circuit 86. As shown by the first two waveforms in FIG. 6A, both signals Osc and O/S have 50% duty cycles but are 180° out of phase at zero manifold vacuum. As manifold vacuum increases, the manifold vacuum signal O/S becomes increasingly asymmetrical with the positive-going pulses thereof having increasing pulse width. This is shown by the first two waveforms in FIG. 6B.

In the implementation of the multiplication function of the present invention the two signals O/S and Osc are utilized to develop the Strobe signal for application to terminal (1) of integrated circuit 22. According to this implementation of the invention, the Osc signal is supplied to one input of a two input AND gate 88 and the O/S signal to the other input. The output of AND gate 88 connects to terminal (1) of integrated circuit 22. It will be appreciated therefore that at zero manifold vacuum the two signals O/S and Osc cancel each other so that the Strobe input to terminal (1) of integrated circuit 22 is zero. Such a condition is indicated by the first three waveforms of FIG. 6A. As the intensity of manifold vacuum increases, the width of the O/S pulses increases and Strobe signal pulses are applied to terminal (1). This condition is illustrated by the first three waveforms of FIG. 6B wherein the Osc signal effectively blanks a certain portion of the O/S signal to develop the rectangular Strobe signal waveform. It will be appreciated, therefore, that for zero manifold vacuum the pulse width of the Strobe signal is zero; in other words, the pulses vanish as indicated by the third waveform of FIG. 6A. As the vacuum increases, the width of the Strobe signal pulses correspondingly increases.

Consideration is now given to the development of the accumulation function signal which is the variable to be multiplied by manifold vacuum. As explained above, the connection of resistor 36 and capacitor 38 across the DC supply with the junction of the two being connected to terminals (15), (14) establishes the frequency of the signal developed at terminal (12). While this frequency is satisfactory for development of the accumulation function signal under certain driving modes such as when the engine is operating in a non-idle condition, it may be desirable to modify the frequency of oscillation for other driving modes such as when the engine is operating at idle. Accordingly, an idle sensing switch 90 and associated circuitry are utilized to modify the timing characteristic of the RC circuit defined by resistor 36 and capacitor 38 when the engine is at idle. Switch 90 is a grounding type switch which is open when the throttle is in a non-idle position and which closes when the engine throttle returns to idle. The circuitry associated with switch 90 includes a suppression capacitor 92 shunting switch 90, a PNP transistor 94, a diode 96, and resistors 98, 100, and 102. The emitter of transistor 94 connects to the $+V_{DD}$ terminal, while the collector connects through diode 96 and resistor 102 to the junction of resistor 36 and capacitor 38. Resistor 98 couples switch 90 to the base of transistor 94, and resistor 100 connects from the junction of resistor 98 and switch 100 to $+V_{DD}$. As can be seen from consideration of this circuit arrangement, the emitter-collector circuit of transistor 94, diode 96, and resistor 102 form a circuit which is in shunt with resistor 36. When switch 90 is open (non-idle condition), transistor 94 is not conducting, and the circuit has no influence on the RC timing characteristic of resistor 36 and capacitor 38. However, when switch 90 closes to bias transistor 94 for conduction (idle condition), resistor 102 is effectively inserted in parallel with resistor 36 to thereby modify the RC timing characteristic of the circuit by reducing the RC time constant thereof. This means that under this condition the frequency of the waveform at terminal (12) of integrated circuit 22 increases. At idle the frequency of the signal at terminal (12) is greater than at non-idle.

Switch 90 is also coupled through a resistor 104 to the up/down control terminal (5) of integrated circuit 22. With this arrangement the seven stage binary counter 30 is integrated circuit 22 will count up when the engine is in idle and down when the engine is in non-idle.

Terminal (13) is connected to ground through a resistor 106 so that the bypass control applied to gate 28 of integrated circuit 22 causes the frequency-divided version of the oscillator signal from counter 28 to appear at terminal (12).

A coolant switch 108, which senses engine coolant temperature, also controls the conduction of transistor 94. Switch 108 is of the grounding type and is connected through a diode 110 to the junction of resistors 100 and 98 where switch 90 also connects. Switch 108 is shunted by its own suppression capacitor 112. Switch 108 remains closed until the engine has warmed up at which point it opens. Thus, it operates to hold transistor 94 in conduction until the engine has warmed up regardless of how switch 90 has been operated. Once the engine has warmed up, switch 108 ceases to hold transistor 94 in conduction whereby transistor 94 is under the sole control of switch 90 after warmup. Diode 110 isolates switches 90 and 108 for a test purpose which will be explained later.

Thus, once the engine has warmed up the circuit operates in the following fashion. When the engine is in non-idle, switch 90 is open and the frequency-divided pulse waveform signal appearing at terminal (12) is supplied via the external jumper to terminal (11) and the seven stage binary counter 30. The count in counter 30 changes one increment for each pulse of the input signal. The R-2R network 32 converts the binary signal of counter 30 into an equivalent analog signal which is supplied to buffer 34. Correspondingly, when the engine throttle returns to idle and switch 90 closes, the count in the seven stage binary counter 30 will change in the opposite direction one increment per input trigger pulse at the increased frequency. It is in this way that the accumulation function signal, or accumulator signal, is developed to be representative of the duration for which the engine has been operating in selected operating modes. The value of the accumulator signal is limited both maximally and minimally by the latching effect of the counter explained above.

Transmission of the analog signal output of buffer 34 corresponding to the accumulator signal supplied to the buffer is selectively controlled by the Strobe signal supplied to terminal (1) from AND gate 88. The Output signal at terminal (3) is thus a rectangular waveform signal whose pulse amplitude is proportional to the accumulator signal and whose pulse width is directly proportional to manifold vacuum. This is shown by the fourth output waveform in FIG. 6B. It can be seen that the area of each output pulse is directly proportional to the product of the accumulator signal and engine manifold vacuum.

In order to develop the programmed vacuum advance signal which is an analog signal whose magnitude is representative of the programmed vacuum spark advance, the output waveform at terminal (3) is supplied as an input to a low pass filter circuit 114. Circuit 114 comprises a comparator 116 whose non-inverting input is coupled to terminal (3) by an RC filter consisting of a resistor 118 and a capacitor 120. The inverting input of comparator 116 is coupled through a resistor 122 and diode 124 to the collector of transistor 94. Circuit 114 includes additional resistors 124, 126, 128, 130, and capacitor 132 which are connected as illustrated in FIG. 1. The programmed vacuum advance signal is represented by the change in output current flow through resistor 130 into a summing junction at which other advance signals are summed together to develop the total spark advance signal for the ignition system. The analog signal is illustrated by the last waveform of FIGS. 6A and 6B for the respective vacuum and accumulation function signal conditions indicated. As can be seen from the last waveform of FIG. 6B, the signal is an analog one whose magnitude is proportional to the area of the output pulses appearing at terminal (3). The connection of the inverting input through resistor 122 and diode 124 to the collector of transistor 94 establishes a cancellation feature whereby when transistor 94 is non-conductive (i.e. engine either not warmed up or in idle), the programmed vacuum advance signal is caused to assume a zero value. However, after the engine has warmed up and is operating in a non-idle condition, the programmed vacuum spark advance signal (i.e. the product signal) has its magnitude proportional to the product of the two variables, namely the accumulation function signal and the engine manifold vacuum signal.

An offset control voltage can be applied, if desired to impart an offset characteristic to the accumulation function signal as explained in the parent application Ser. No. 772,604. One way of doing this is by the voltage divider composed of resistors 138 and 140 connected with $+V_{DD}$ and terminal (3), as illustrated in FIG. 1.

If desired, an offset can be imparted to the vacuum signal by adjusting the frequency of the signal Osc with appropriate adjustment of the output gain. For example, by increasing the frequency so that a half cycle of the Osc signal has a width less than the width of the negative-going pulse of the O/S signal by a given amount at zero vacuum, the manifold vacuum must rise to a predetermined minimum determined by said given amount before the Strobe signal is produced. This creates the vacuum signal offset. Thereafter, the width of the Strobe signal pulses will correspondingly increase as vacuum rises above the offset. When such offset is used, the resultant Product signal, while still directly proportional to the area of the pulses of the Output signal, is not numerically equal to the product of vacuum and accumulation function.

As noted earlier, diode 110 isolates switches 90 and 108 for a test purpose. The test procedure involves testing the integrated circuit 22 by selectively applying a test signal input to terminal (13) for testing the operation of counter 30 and related counting circuitry used in developing the accumulation function. A safety circuit consisting of a resistor 133, a zener diode 134, and a diode 136 connected as illustrated limits the maximum voltage which can be applied to terminal (13) to one diode drop above $+V_{DD}$. This safety circuit, therefore, protects integrated circuit 22 should too high a positive potential signal accidentally be applied during testing to either the terminal 108a to which coolant switch 108 connects or the terminal 90a to which idle sensing switch 90 connects.

What is claimed is:

1. A circuit for multiplying two variables to obtain a DC signal whose magnitude is proportional to the product thereof, one of said two variables being represented by the pulse width of the pulses of a constant frequency rectangular waveform but whose zero value is represented by a definite non-zero width of said pulses, the other of said variables being represented by a variable amplitude signal comprising:

means for generating a constant frequency rectangular waveform comprising pulses whose width is representative of said one variable but which have a non-zero width when the value of said one variable is zero;

means for generating a reference rectangular waveform at the same frequency as that of said constant frequency rectangular waveform;

means for producing from said constant frequency rectangular waveform and said reference rectangular waveform, a third rectangular waveform having zero pulse width when the value of said one variable is zero and having a pulse width which increases from zero as the value of said one variable increases from zero;

a variable amplitude signal source providing said variable amplitude signal;

means for producing from said third rectangular waveform and from said variable amplitude signal a fourth rectangular waveform whose pulse amplitude is representative of the level of said variable amplitude signal and whose pulse width is directly proportional to that of said third rectangular waveform;

and low pass filter means receiving said fourth rectangular waveform to produce a DC signal whose magnitude is proportional to the product of said two variables.

2. A circuit for obtaining the product of two variables comprising:

a transducer for sensing one of said variables having a characteristic such that when the value of said one variable is zero, the transducer produces a non-zero output;

transducer circuit means connected with said transducer for producing a constant frequency rectangular waveform having pulses whose pulse width is directly proportional to the output of said transducer;

means for generating a reference rectangular waveform at the same frequency as that of said constant frequency rectangular waveform;

means for producing from said constant frequency and said reference rectangular waveforms a third rectangular waveform having zero pulse width when the value of said one variable is zero and having a pulse width which increases from zero as the value of said one variable increases from zero;

a variable amplitude signal source providing a variable amplitude signal whose level is representative of the value of the other of said two variables;

means for producing from said third rectangular waveform and from said variable amplitude signal is representative of the value of the other of said two a fourth rectangular waveform whose pulse amplitude is representative of the level of said variable amplitude signal and whose pulse width is directly proportional to that of said third rectangular waveform;

and low pass filter means receiving said fourth rectangular waveform to develop a DC signal whose magnitude is proportional to the product of said two variables.

3. A circuit for multiplying two variables to obtain a DC signal whose magnitude is proportional to the product thereof comprising:

means for generating a first rectangular waveform at a predetermined frequency and pulse width;

means for generating a second rectangular waveform at the same frequency as that of said first rectangular waveform and for varying the pulse width of said second rectangular waveform as a function of the value of one of said two variables such that when the value of said one variable is zero, the pulses of said second rectangular waveform have a definite non-zero pulse width and increase in width as the value of said parameter increasingly departs from zero;

means for producing from said first and second rectangular waveforms a third rectangular waveform whose pulses have zero pulse width when the value of said one variable is zero and have an increasing pulse width as the value of said one variable increasingly departs from zero;

means providing a variable amplitude signal whose level is representative of the value of the other of said variables;

means for producing from said variable amplitude signal and from said third rectangular waveform a fourth rectangular waveform whose pulse amplitude is representative of the level of said variable amplitude signal and whose pulse width is directly proportional to that of said third rectangular waveform;

and low pass filter means receiving said fourth rectangular waveform to develop a DC signal whose magnitude is proportional to the product of said two variables.

* * * * *